United States Patent
Park et al.

(10) Patent No.: US 8,198,163 B2
(45) Date of Patent: Jun. 12, 2012

(54) METHOD OF FABRICATING SEMICONDUCTOR DEVICE

(75) Inventors: Joo-sung Park, Suwon-si (KR); Se-keun Park, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 273 days.

(21) Appl. No.: 12/591,239

(22) Filed: Nov. 13, 2009

(65) Prior Publication Data

US 2010/0124808 A1     May 20, 2010

(30) Foreign Application Priority Data

Nov. 17, 2008   (KR) .................. 10-2008-0114033

(51) Int. Cl.
*H01L 21/8234* (2006.01)
(52) U.S. Cl. ................. 438/275; 438/528; 257/E21.619
(58) Field of Classification Search ........... 438/528, 438/918; 257/E21.343, E21.678, E21.683
See application file for complete search history.

(56) References Cited

U.S. PATENT DOCUMENTS

| 7,320,921 B2 * | 1/2008 | Wang et al. | 438/306 |
| 7,422,968 B2 * | 9/2008 | Lu et al. | 438/528 |

FOREIGN PATENT DOCUMENTS

| JP | 07-029852 A | 1/1995 |
| KR | 10-2005-0000059 A | 1/2005 |
| KR | 10-2005-0049610 A | 5/2005 |

* cited by examiner

*Primary Examiner* — Chandra Chaudhari
(74) *Attorney, Agent, or Firm* — Lee & Morse, P.C.

(57) ABSTRACT

A method of fabricating a semiconductor device including forming a plurality of gate structures on a semiconductor substrate, forming a plurality of impurity regions in the semiconductor substrate at sides of the gate structures, forming a dielectric layer on the semiconductor substrate having the gate structures, forming contact holes by etching the dielectric layer to expose parts of the impurity regions at sides of the gate structures, directly implanting impurity ions into the exposed parts of the impurity regions via the contact holes by using the gate structures as ion implanting masks, wherein the impurity ions prevent impurities doped in the impurity regions from diffusing to channel regions of the gate structures, and forming conductive plugs in the contact holes.

17 Claims, 12 Drawing Sheets

METHOD OF FABRICATING SEMICONDUCTOR DEVICE

BACKGROUND

1. Field

Embodiments relate to a method of fabricating a semiconductor device.

2. Description of the Related Art

An increase in the degree of integration of semiconductor devices has led to a reduction in the sizes of the devices as well as gate lengths of MOS transistors. As the gate lengths of the MOS transistors become shorter, a threshold voltage may decrease and a short-channel effect may increase, thereby degrading the performance of the MOS transistors. In particular, a leakage current may cause disturbances in bit lines of a semiconductor memory device, e.g., dynamic random access memory (DRAM), in an off state.

SUMMARY

Embodiments are directed to a method of fabricating a semiconductor device, which substantially overcomes one or more of the drawbacks, limitations, and/or disadvantages of the related art.

It is a feature of an embodiment to provide a method of fabricating a semiconductor device including implanting fluoride ions into source and drain regions after forming contact holes.

At least one of the above and other features and advantages may be realized by providing a method of fabricating a semiconductor device including forming a plurality of gate structures on a semiconductor substrate, forming a plurality of impurity regions in the semiconductor substrate at sides of the gate structures, forming a dielectric layer on the semiconductor substrate having the gate structures, forming contact holes in the dielectric layer to expose parts of the impurity regions at sides of the gate structures, directly implanting impurity ions into the exposed parts of the impurity regions via the contact holes by using the gate structures as ion implanting masks, wherein the impurity ions prevent impurities doped in the impurity regions from diffusing to channel regions of the gate structures, and forming conductive plugs in the contact holes.

The impurity ions may include fluoride ions.

The directly implanting impurity ions may include performing a dry cleaning process using plasma containing fluoride radicals to implant fluoride ions into the impurity regions while cleaning the exposed parts of the impurity regions.

The directly implanting impurity ions may include cleaning the exposed parts of the impurity regions, and implanting fluoride ions into the impurity regions through an ion implanting process.

The directly implanting impurity ions may include performing a dry cleaning process using plasma containing fluoride radicals while cleaning the exposed parts of the impurity regions to implant fluoride ions into the impurity regions, and subsequently, performing an ion implanting process to implant fluoride ions into the impurity regions.

The conductive plugs may include metal plugs or polysilicon plugs.

Each of the impurity regions may include a heavily doped region at a side of the gate structures in the semiconductor substrate, and a lightly doped region between the heavily doped region and a channel region below the gate structures.

Directly implanting impurity ions may include implanting impurity ions only in the heavily doped region.

The semiconductor substrate may include a memory region and a peripheral circuit region in which the gate structures and the impurity regions are arranged, and the directly implanting impurity ions may be performed in the peripheral circuit region and includes directly implanting fluoride ions into the impurity regions in the peripheral circuit region.

The semiconductor substrate may include a high-voltage region, a medium-voltage region, and a low-voltage region, and the directly implanting impurity ions may include directly implanting fluoride ions into the impurity regions in at least one of the high-voltage region, the medium-voltage region, and the low-voltage region.

The fluoride ions may be directly implanted in the impurity region of the high-voltage region and the medium-voltage region, and the directly implanting impurity ions in the impurity region of the high-voltage region and the medium-voltage region may include forming a photosensitive layer on the low-voltage region, the photosensitive layer preventing fluoride ion implantation in the low-voltage region.

The directly implanting impurity ions may include performing a dry cleaning process using plasma containing fluoride radicals and performing a separate fluoride ion implanting process on the semiconductor substrate.

The fluoride ions may be directly implanted in the impurity region of the high-voltage region, and the directly implanting impurity ions in the impurity region of the high-voltage region may include forming a photosensitive layer on the low-voltage region and the medium-voltage region, the photosensitive layer preventing fluoride ion implantation in the low-voltage region and the medium-voltage region.

The directly implanting impurity ions may include performing the dry cleaning process using plasma containing fluoride radicals and performing a separate fluoride ion implanting process on the semiconductor substrate.

The directly implanting impurity ions may include performing a dry cleaning process on the semiconductor substrate using plasma containing fluoride radicals, forming a photosensitive layer on at least one of the high-voltage region, the medium-voltage region, and the low-voltage region, the photosensitive layer protecting the at least one high-voltage region, medium-voltage region, and low-voltage region from fluoride ion implantation, and performing an ion implanting process on the semiconductor substrate.

The photosensitive layer may be formed on the low-voltage region to prevent fluoride ion implantation in the low-voltage region.

The photosensitive layer may be formed on the low-voltage region and the medium-voltage region to prevent fluoride ion implantation in the low-voltage region and the medium-voltage region.

Forming the plurality of impurity regions may include implanting impurities of a predetermined conductive type in the semiconductor substrate at the sides of the gate structures prior to directly implanting the impurity ions, and implanting impurities of the predetermined conductive type after the directly implanting impurity ions and prior to forming the conductive plugs.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1A:
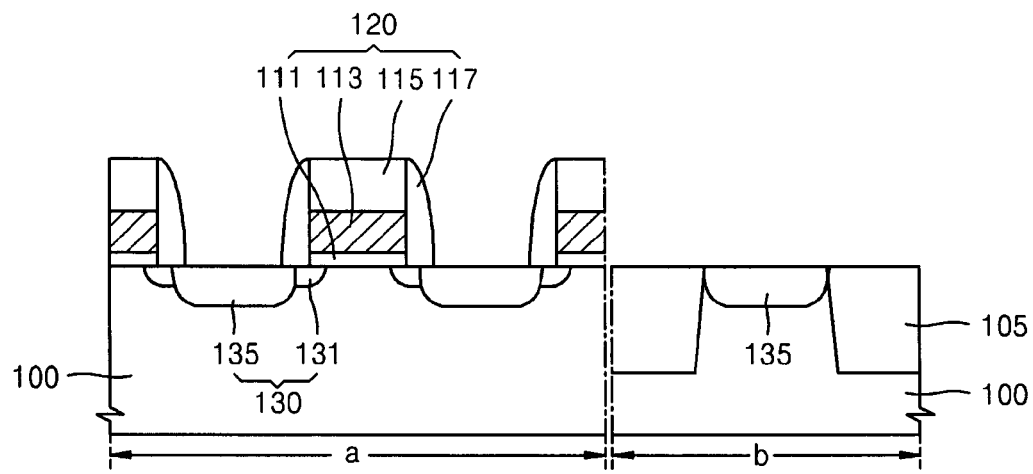
FIGS. 1A through 1F illustrate cross-sectional views of stages in a method of fabricating a semiconductor device according to an embodiment.

Korean Patent Application No. 10-2008-0114033, filed on Nov. 17, 2008, in the Korean Intellectual Property Office, and entitled: "Method of Fabricating Semiconductor Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIGS. 1A through 1F illustrate cross-sectional views of stages in a method of fabricating a semiconductor device according to an embodiment. In FIGS. 1A through 1F, 'a' denotes a cross-sectional view taken along a line traversing a gate in a direction of the width of the gate and 'b' denotes a cross-sectional view taken along a line traversing a contact hole in a direction of the length of the gate.

Referring to FIG. 1A, a plurality of gate structures 120 may be disposed on predetermined locations of a semiconductor substrate 100. In each of the gate structures 120, a gate insulating layer 111, a gate electrode 113, and a capping layer 115 may be sequentially formed on the predetermined location of the semiconductor substrate 100. In addition, spacers 117 may be formed along sidewalls of the gate insulating layer 111, gate electrode 113, and capping layer 115.

The gate insulating layer 111 may include, e.g., at least one oxide layer. The gate electrode 113 may include, e.g., a stacked structure of a polysilicon layer and a tungsten layer. The capping layer 115 may include, e.g., a nitride layer. Each of the spacers 117 may include, e.g., at least one nitride layer.

A plurality of impurity regions 130 as source/drain regions may be formed at sides of the gate structures 120 in the semiconductor substrate 100. Each of the impurity regions 130 may include a lightly doped drain (LDD) structure. In particular, each of the impurity regions 130 may include a heavily doped region 135 formed at sides of the gate structures 120 in the semiconductor substrate 100 and a lightly doped region 131 formed between a channel region below the gate electrode 113 and the heavily doped region 135 in the semiconductor substrate 100. The impurity regions 130 may be doped with impurities of a conductivity type opposite to that of the semiconductor substrate 100. The lightly doped region 131 may include an impurity region into which, e.g., phosphorous or arsenic materials, are doped. The heavily doped region 135 may include an impurity region into which, e.g., arsenic or phosphorous materials, are doped.

Figure 1B:
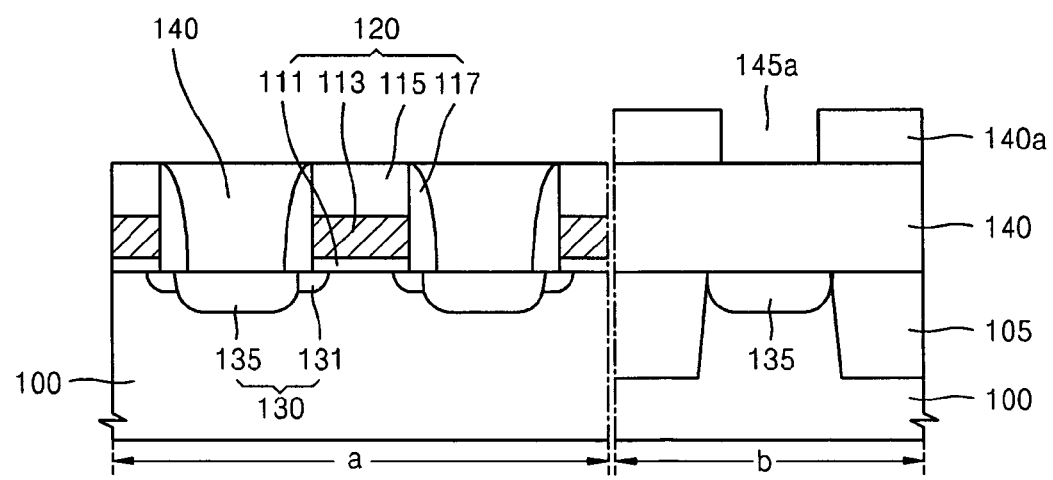

Referring to FIG. 1B, a dielectric layer 140 may be formed on the semiconductor substrate 100. The dielectric layer 140 may include, e.g., an oxide layer-based interlayer dielectric layer. The dielectric layer 140 may be formed by, e.g., depositing the interlayer dielectric layer on the semiconductor substrate 100 and the gate structures 120 and then etching the interlayer dielectric layer through, e.g., chemical mechanical polishing (CMP) or an etch back process using the gate structures 120 as an etch stop layer.

A photosensitive layer 140a may be formed on the dielectric layer 140. The photosensitive layer 140a may include an opening 145a through which at least part of the dielectric layer 140 corresponding to the impurity region 130 at sides of the gate structures 120 may be exposed.

Figure 1C:
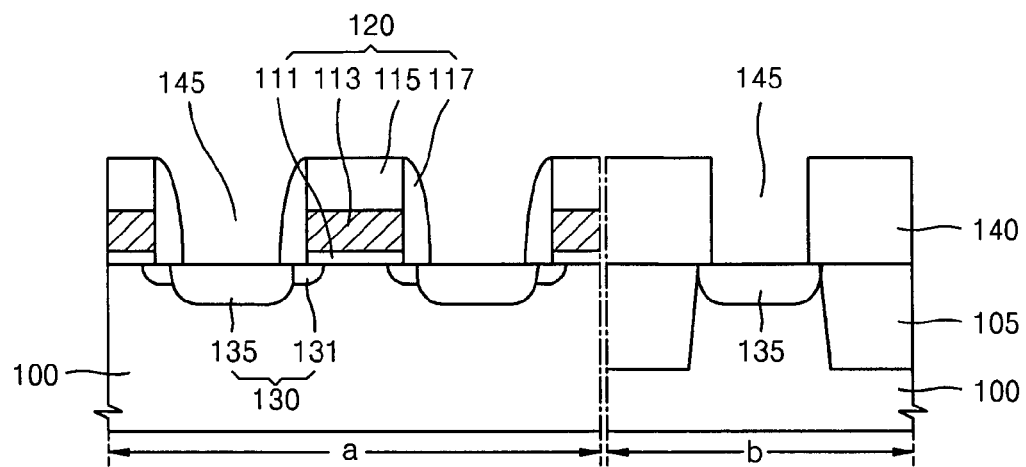

Referring to FIG. 1C, a plurality of contact holes 145 exposing parts of the impurity regions 130 may be formed by etching the exposed part of the dielectric layer 140 using the photosensitive layer 140a as an etch mask. The contact holes 145 may be, e.g., self-aligned contact holes obtained according to a process of forming self-aligned contacts (SAC). Then, the photosensitive layer 140a may be removed.

Figure 1D:
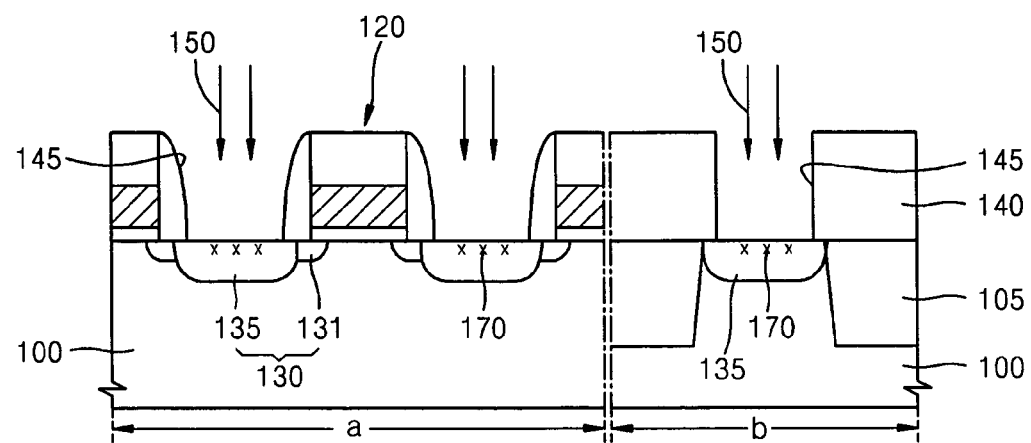

Next, referring to FIG. 1D, a cleaning process may be performed. Fluoride ions 170 may first be implanted into the exposed parts of the impurity region 130 while performing a dry cleaning process using plasma 150 containing, e.g., fluoride radicals.

Figure 1E:
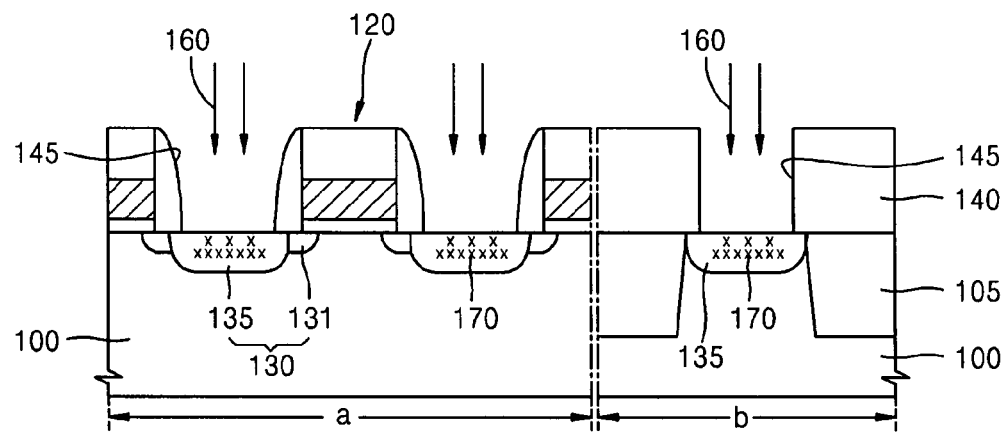

Referring to FIG. 1E, after performing the cleaning process, fluoride ions 170 may again be implanted into the impurities regions 130 by performing an ion implanting process 160. In the ion implanting process 160, the fluoride ions 170 may be directly implanted into the exposed parts of the impurity regions 130 via the contact holes 145 by using the gate structures 120 as ion implanting masks. The fluoride ions may be implanted in the heavily doped region 135, and may not be implanted in the lightly doped region 131. For example, the spacers 117 may cover the lightly doped region 131, and may limit fluoride ion implantation to only the heavily doped region 135. A source of fluoride ions 170 for the ion implantation process 160 may include, e.g., $F_2$, $CF_x$, and/or $CH_xF_y$.

In an implementation, the fluoride ions may be implanted into the exposed parts of the impurity regions 130 via the contact holes 145 using only the cleaning process illustrated in FIG. 1D, and the ion implanting process of FIG. 1E may be omitted. In another implementation, insides of the contact holes 145 may be cleaned during the cleaning process of FIG. 1D using a general non-fluoride cleaning process, and then the ion implanting process of FIG. 1E may be performed in order to implant the fluoride ions 170 into the impurity regions 130 via the cleaned contact holes 145.

Figure 1F:
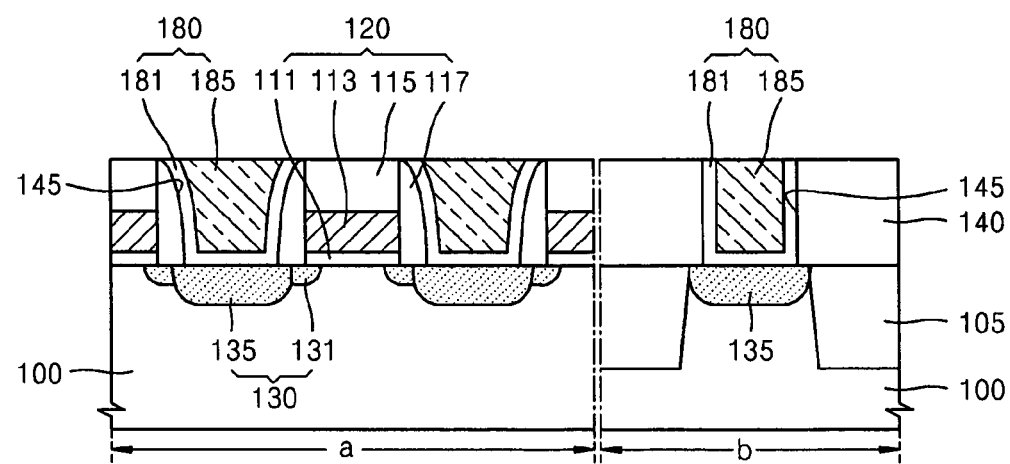

Referring to FIG. 1F, a heating process may be performed in order to diffuse the fluoride ions that were implanted into the impurities regions 130. Then, a barrier material 181 may be applied onto the dielectric layer 140 having the contact holes 145. A conductive material 185 may then be applied onto the barrier material 181 to fill the contact holes 145 with the conductive material 185. The barrier material 181 and the conductive material 185 may then be etched in order to form contact plugs 180 in the contact holes 145.

The etching of the barrier material 181 and the conductive material 185 in order to form the contact plugs 180 may include etching the barrier material 181 and the conductive material 185 through, e.g., CMP or an etch back process, until at least an upper surface of the dielectric layer 140 is exposed. The barrier material 181 may include, e.g., a Ti/TiN layer. The conductive material 185 may include, e.g., a polysilicon layer. The polysilicon layer may include, e.g., a polysilicon layer doped with N+ type impurities. The N+ type impurities may include, e.g., phosphorus.

Prior to forming the contact plugs 180, impurities of the same conductive type as the impurities in the impurity region 130 may be additionally doped in order to improve a contact resistance in the impurities regions 130. Thus, the impurity region 130 may be doped with impurities, fluoride ions may be implanted, and then the impurity region 130 may be doped with impurities again.

Diffusion of the fluoride ions implanted into the impurity regions 130 may include diffusing the fluoride ions by performing a separate heating process thereon after implantation of the fluoride ions. Alternatively, the fluoride ions may be diffused during a subsequent heating process used in a different fabrication process during manufacture of the semiconductor device.

Figure 2A:
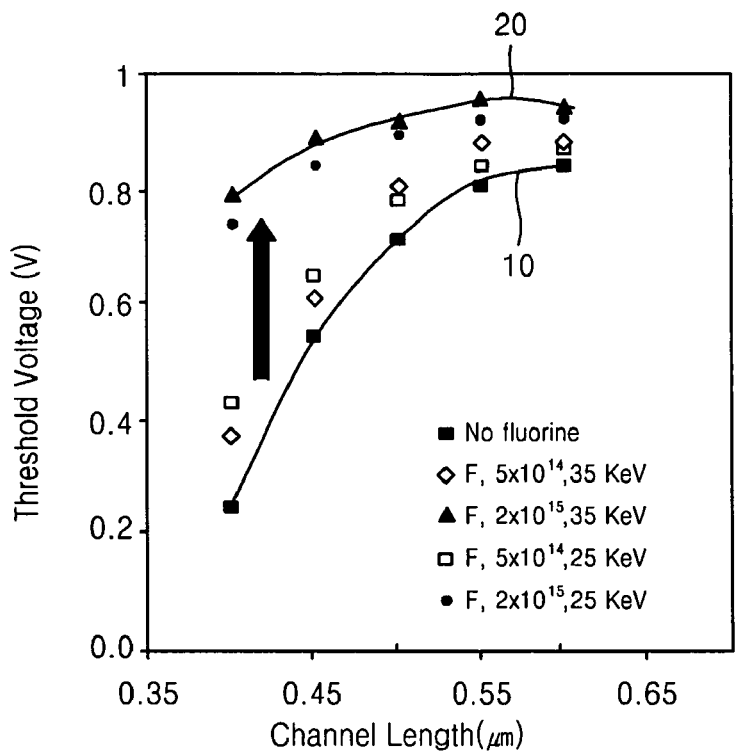
FIG. 2A illustrates a graph of a relationship between a channel length and a threshold voltage in a semiconductor device according to an embodiment as compared to a typical semiconductor device.
Figure 2B:
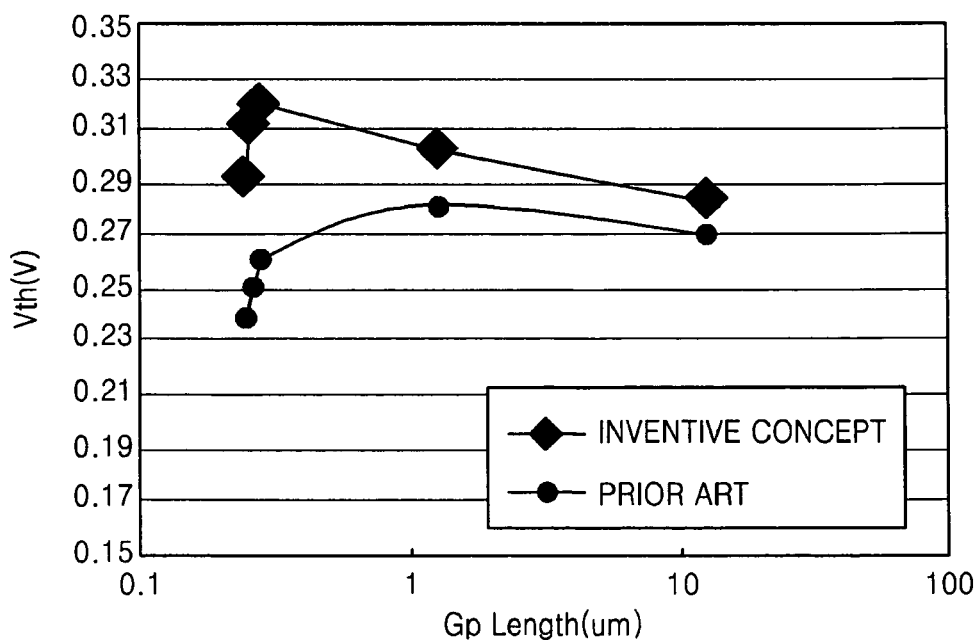
FIG. 2B illustrates a graph of a relationship between a gate length and a reverse short-channel effect in a semiconductor device according to an embodiment as compared to a typical semiconductor device.

FIG. 2A illustrates a graph of a relationship between channel length and threshold voltage in a semiconductor device according to an embodiment as compared to a typical semiconductor device. FIG. 2B illustrates a graph of a relationship between gate length and reverse short-channel effect in a semiconductor device according to an embodiment as compared to a conventional semiconductor device.

Referring to FIGS. 2A and 2B, in the semiconductor device according to an embodiment, phosphorus or arsenic may be prevented from diffusing into channel regions from impurity regions into which the fluoride ions have been implanted. Thus, a channel length of a transistor may be reduced and a threshold voltage may be gently lowered as indicated with a curve 20. The threshold voltage may increase in proportion to an amount of the fluoride ions implanted into the impurity regions and an ion implanting energy of the fluoride ions implanted into the impurity regions. However, in the typical semiconductor device in which fluoride ions are not implanted into impurity regions, although a channel length of a transistor may be reduced, the threshold voltage may be sharply lowered as indicated with a curve 10.

Also, a reverse short-channel effect, in which the channel length of the transistor is decreased, in the semiconductor device according to an embodiment may be greatly improved compared to a typical semiconductor device. In the semiconductor device according to an embodiment, the threshold voltage may be higher than in the typical semiconductor device with respect to the same channel length. Accordingly, a channel length (or gate length) in the semiconductor device according to an embodiment may actually be longer than in the typical semiconductor device.

Figure 3A:
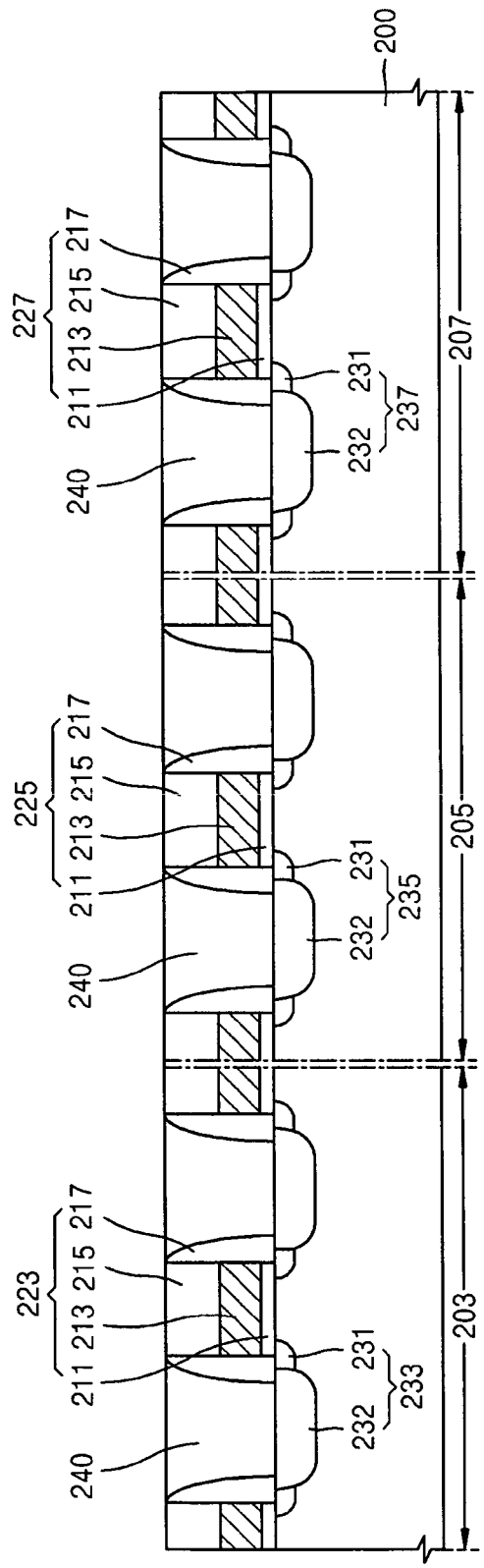
FIGS. 3A through 3D illustrate cross-sectional views of stages in a method of fabricating a semiconductor device according to another embodiment.

FIGS. 3A through 3D illustrate cross-sectional views of stages in a method of fabricating a semiconductor device according to another embodiment. Referring to FIG. 3A, a semiconductor substrate 200 may be prepared. The semiconductor substrate 200 may include a first region 203, a second region 205, and a third region 207. The first region 203 may include a high-voltage region in which high-voltage transistors are arranged. The third region 207 may include a low-voltage region in which low-voltage transistors are arranged. The second region 205 may include a medium-voltage region in which medium-voltage transistors are arranged.

First through third gate structures 223, 225, and 227 may be respectively disposed on the semiconductor substrate 200 in the first through third regions 203, 205, and 207. Each of the gate structures 223, 225, and 227 may include a sequentially stacked gate insulating layer 211, gate electrode 213 and gate capping layer 215. In addition, each of the gate structures 223, 225, and 227 may include gate spacers 217 along side walls of the gate insulating layer 211, the gate electrode 213, and the gate capping layer 215.

Impurity regions 233, 235, and 237 respectively corresponding to first through third source/drain regions may be formed at sides of the first through third gate structures 223, 225, and 227 in the semiconductor substrate 200. Each of the impurity regions 233, 235, and 237 may have an LDD structure having a lightly doped region 231 and a heavily doped region 232 formed by the same process described above with reference to FIG. 1E. A dielectric layer 240 may be formed on the semiconductor substrate 200 including the first through third gate structures 223, 225, and 227.

Figure 3B:
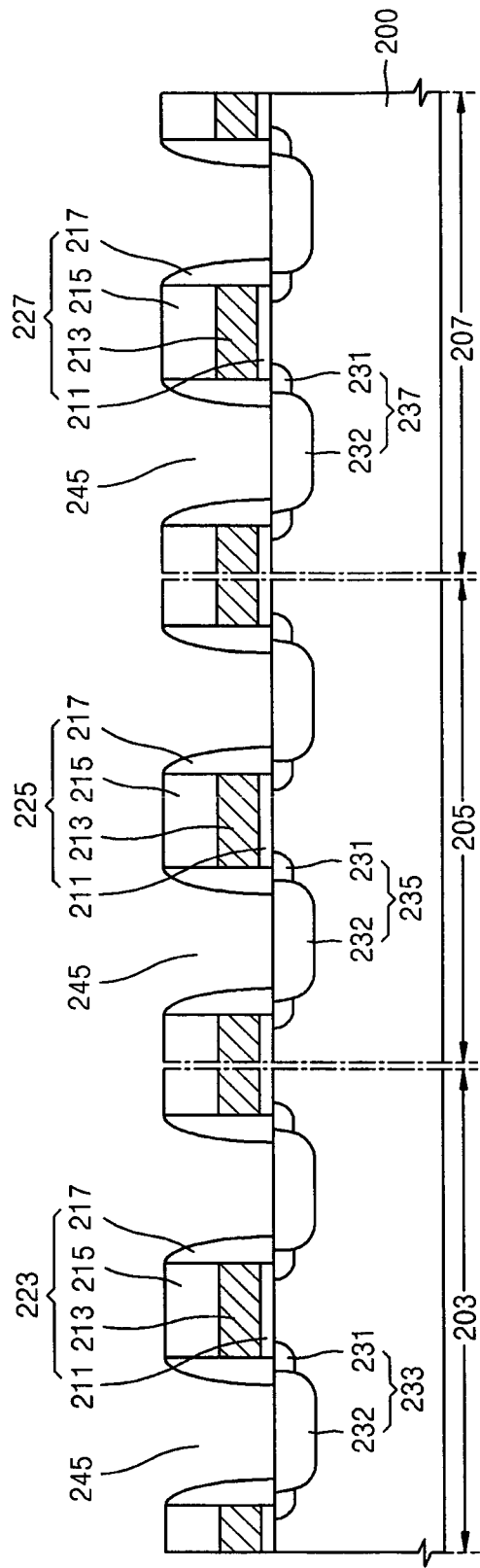

Referring to FIG. 3B, the dielectric layer 240 may be etched using, e.g., a self-aligned contact process in order to form self-aligned contact (SAC) holes. Parts of the first through third impurity regions 233, 235, and 237 at sides of the gate structures 223, 225, and 227 may be exposed through the SAC holes.

Figure 3C:
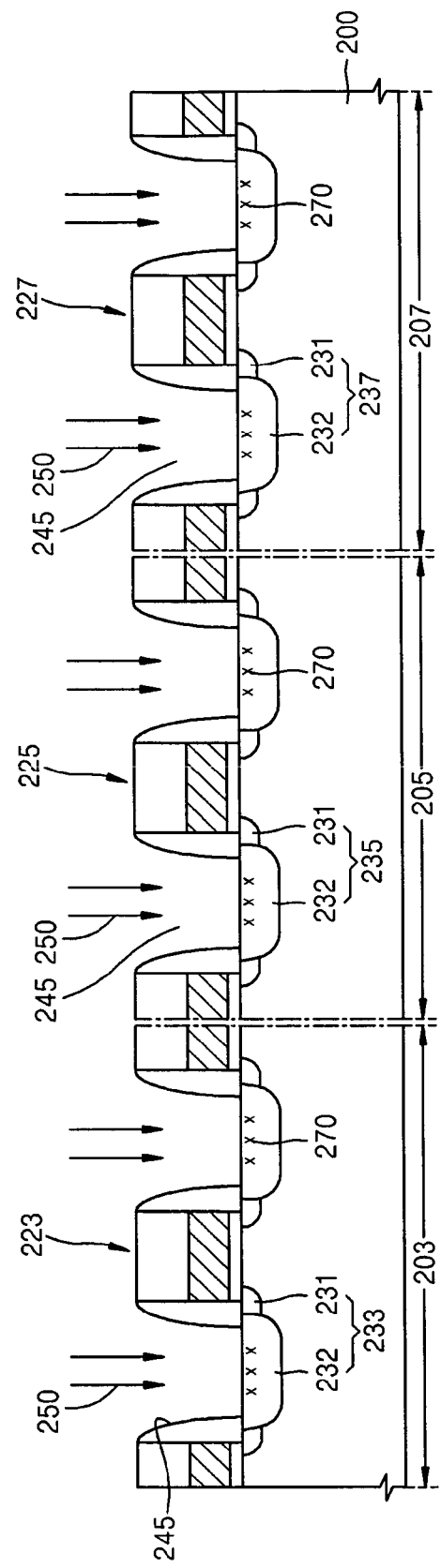

Next, referring to FIG. 3C, a cleaning process may be performed. For example, a dry cleaning process using plasma 250 containing, e.g., fluoride radicals, may be performed in order to implant fluoride ions 270 into the first through third impurity regions 233, 235, and 237.

Figure 3D:
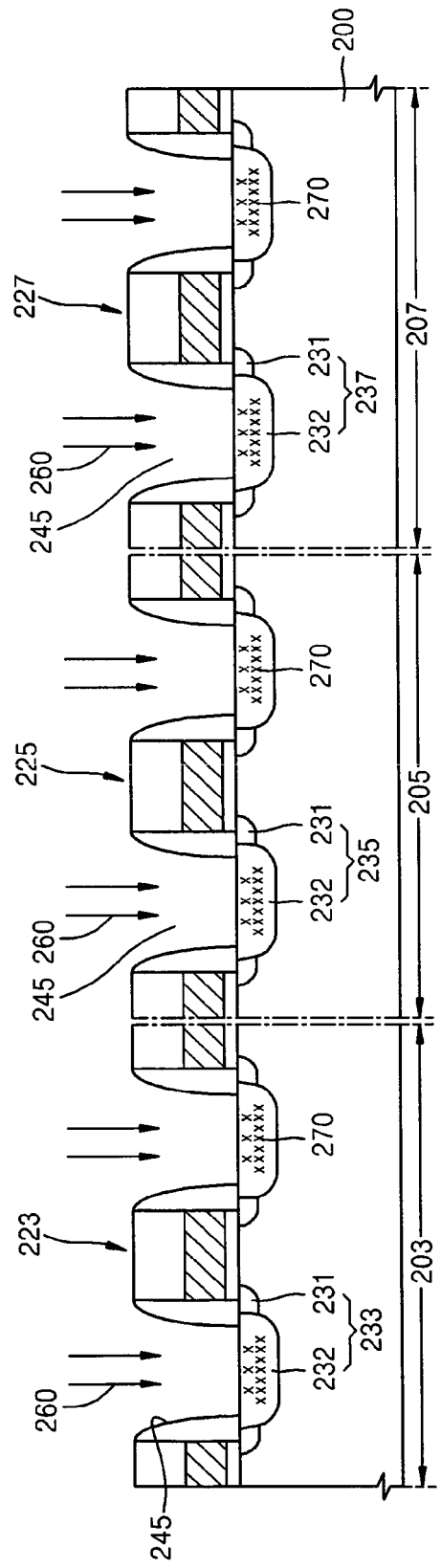

Referring to FIG. 3D, after performing the cleaning process, an ion implanting process 260 may be performed using the first through third gate structures 223, 225, and 227 as ion implanting masks in order to directly implant fluoride ions 270 into the exposed parts of the first through third impurities regions 233, 235, and 237 via the contact holes 245. In the ion implanting process 260, the fluoride ions 270 may be implanted into the exposed part of the impurity region of at least one of the first to third regions 203, 205, and 207, e.g., the first impurity region 232 in the first region 203, which may be a high-voltage region.

Then, a heating process may be performed in order to diffuse the fluoride ions implanted into the first through third impurity regions 233, 235, and 237. Contact plugs 180 (FIG. 1F) may then be formed in the contact holes 245.

Figure 4A:
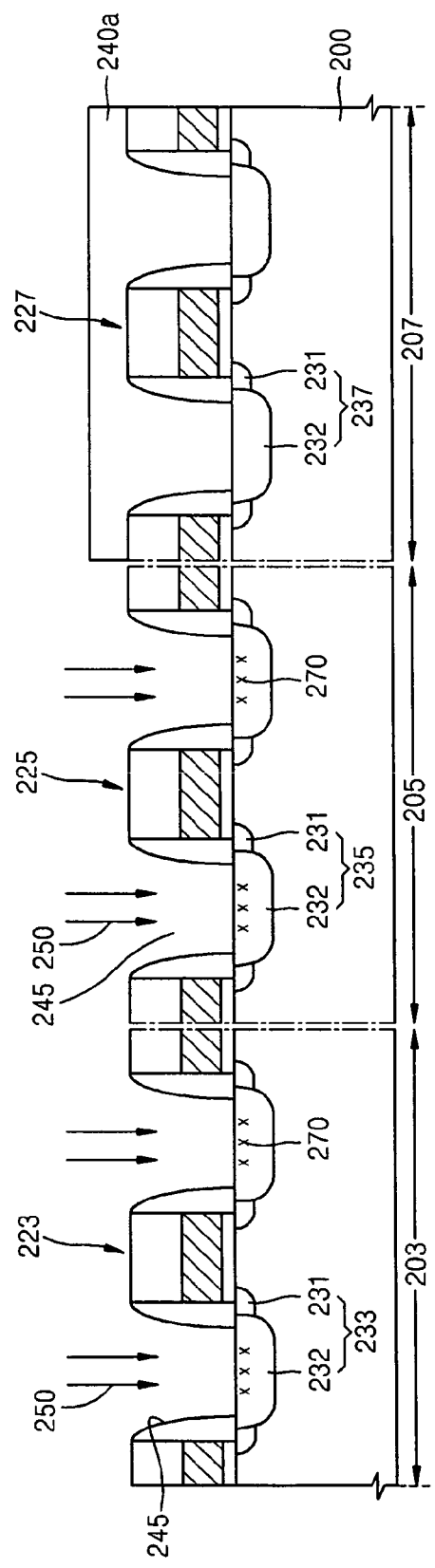
FIGS. 4A and 4B illustrate cross-sectional views of stages in a method of fabricating a semiconductor device according to another embodiment.
Figure 4B:
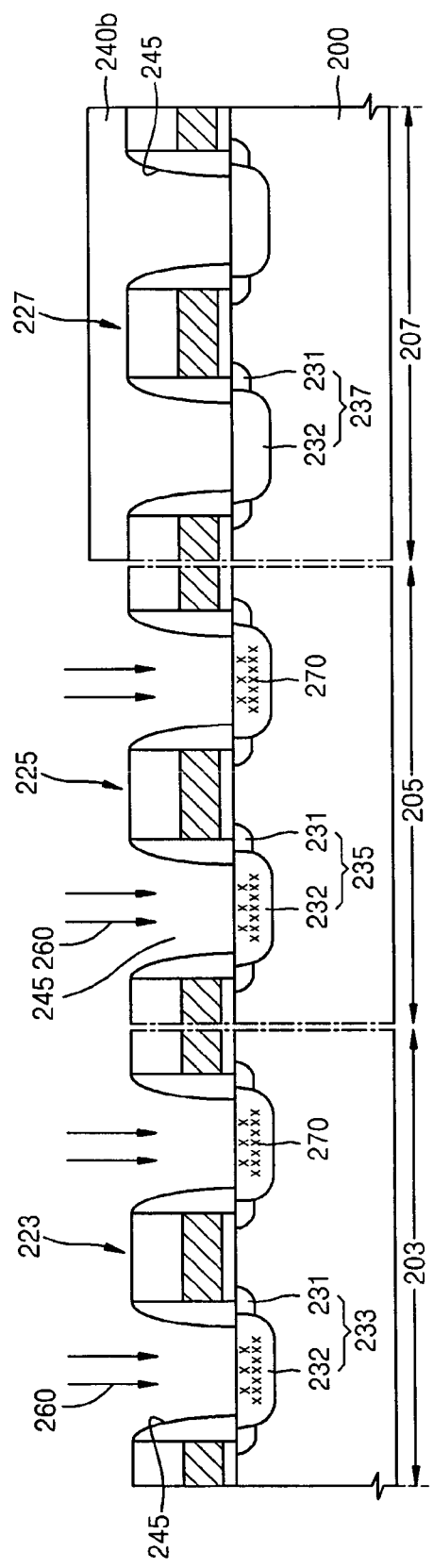

FIGS. 4A and 4B illustrate cross-sectional views of stages in a method of fabricating a semiconductor device according to another embodiment. The current method will be described only with respect to a process of implanting fluoride ions.

Referring to FIG. 4A, contact holes 245 may be formed in a dielectric layer, e.g., the interlayer dielectric layer 240 (FIG. 3A), in first through third regions 203, 205, and 207, in order to expose parts of first through third impurity regions 233, 235, and 237 at sides of first through third gate structures 223, 225, and 227. A photosensitive layer 240a may be formed on the dielectric layer on at least one of the first through third regions 203, 205, and 207, e.g., the third region 207, which may be a low-voltage region.

The photosensitive layer 240a may cover the third impurity regions 237 and expose parts of the first and second impurity regions 233 and 235 via the contact holes 245. Alternatively, the photosensitive layer 240a may cover the second and third impurity regions 235 and 237 and expose parts of the first impurity regions 233 via the contact holes 245. Covering the third impurity regions 237, or the second and third impurity regions 235 and 237, may help ensure that only the first and second impurity regions 233 and 235, or the first impurity regions 233, are exposed for a later-performed ion implanting process 260, described below. Because transistors in the low-voltage region, which corresponds to the third impurity region 237, may have a low threshold voltage Vth, it may not be necessary to, e.g., increase the Vth, by performing a fluoride ion implantation thereon.

Next, a cleaning process may be performed. For example, a dry cleaning process using plasma 250 containing, e.g., fluoride radicals, may be performed in order to primarily implant fluoride ions 270 into the exposed parts of the first and second impurity regions 233 and 235.

Referring to FIG. 4B, after performing the cleaning process, the ion implanting process 260 may be performed using the first and second gate structures 223 and 225 as ion implanting masks in order to directly secondarily implant fluoride ions 270 into the first and second impurity regions 233 and 235 via the contact holes 245. Then, a heating process may be performed in order to diffuse the primarily and secondarily implanted fluoride ions 270 into the first and second impurity regions 233 and 235.

Figure 5A:
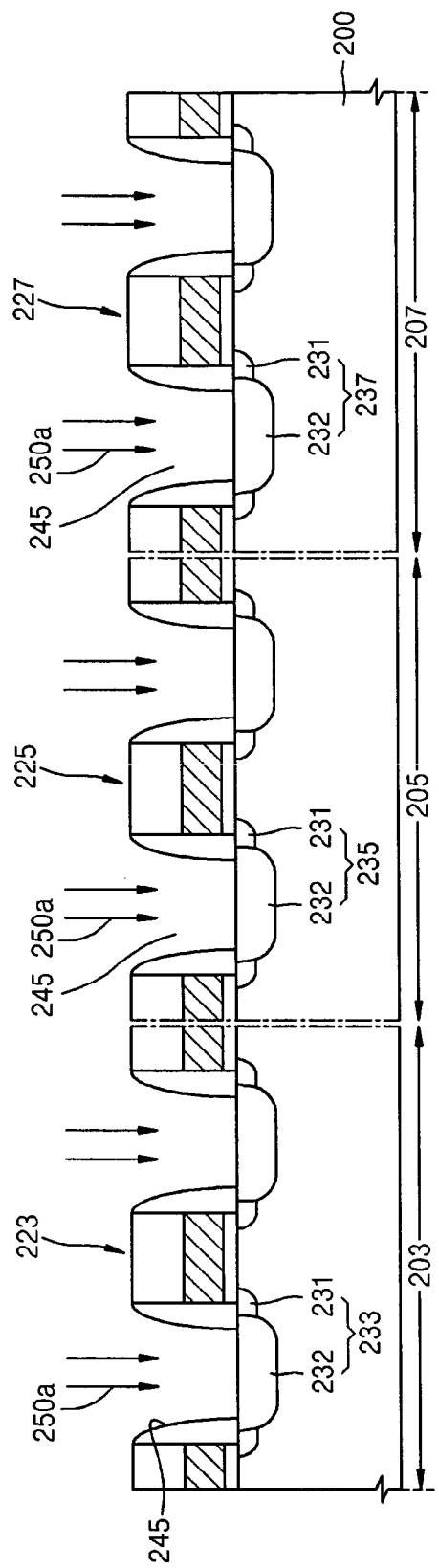
FIGS. 5A and 5B illustrate cross-sectional views of stages in a method of fabricating a semiconductor device according to another embodiment.
Figure 5B:
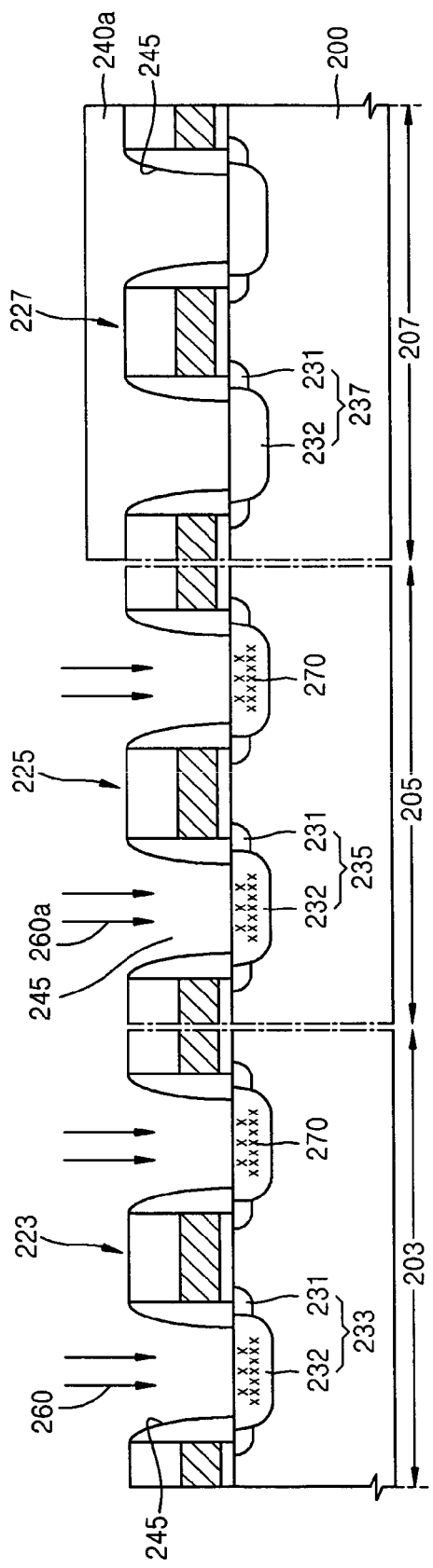

FIGS. 5A and 5B illustrate cross-sectional views of stages in a method of fabricating a semiconductor device according to another embodiment. The current method will be described only with respect to a process of implanting fluoride ions.

Referring to FIGS. 5A and 5B, contact holes 245 may be formed in a dielectric layer, e.g., the interlayer dielectric layer 240 of FIG. 3A, in first through third regions 203, 205, and 207 in order to expose first through third impurity regions 233, 235, and 237 for source/drain regions at sides of first through third gate structures 223, 225, and 227. Then, a cleaning process 250a may be performed. The cleaning process may include, e.g., a dry cleaning process using plasma 250 containing fluoride radicals, as described above.

After performing the cleaning process 250a, a photosensitive layer 240a may be formed on the dielectric layer in at least one of the first through third regions 203, 205, and 207, e.g., the third region 207, which may be a low-voltage region. The photosensitive layer 240a may cover the third impurity regions 237 and expose parts of the first and second impurity regions 233 and 235 via the contact holes 245. Thus, the photosensitive layer 240a may prevent fluoride ion implantation in the third impurity region 237. Alternatively, the photosensitive layer 240a may cover the second and third impurity regions 235 and 237 and expose parts of the first impurity regions 233 via the contact holes 245. Thus, the photosensitive layer 240a may prevent fluoride ion implantation in the second impurity region 235 and the third impurity region 237.

Next, an ion implanting process 260 may be performed using the first and second gate structures 223 and 225 as ion implanting masks in order to directly implant fluoride ions 270 into the first and second impurity regions 233 and 235 via the contact holes 245. Thus, the fluoride ions 270 may not be implanted in the third impurity region 237. Then, a heating process may be performed in order to diffuse the implanted fluoride ions into the first and second impurity regions 233 and 235. Contact plugs 180 (FIG. 1F) may then be formed in the contact holes 245.

In another embodiment, a semiconductor substrate may include a memory region and a peripheral circuit region in which memory cells are arranged. Fluoride ions may be implanted into only impurity regions in the peripheral circuit region as described above with reference to FIGS. 3A to 3D, 4A, 4B, 5A, and 5B.

For example, in order to reduce the short-channel effect, a method of reducing a thickness of a gate insulating layer and a method of forming source and drain regions in a lightly-doped drain (LDD) structure have been introduced. However, reduction of the thickness of a gate insulating layer is limited. In the method of forming source and drain regions in a LDD structure, a reduction in sizes of elements may cause impurities to diffuse from source and drain regions to a channel region and thus the length of an actual effective channel reduces, thereby undesirably increasing the short-channel effect.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a semiconductor device, the method comprising:
    forming a plurality of gate structures on a semiconductor substrate;
    forming a plurality of impurity regions in the semiconductor substrate at sides of the gate structures, wherein forming each of the impurity regions includes:
        forming a lightly doped region at a side of a channel region below the gate structures, and
        forming a heavily doped region at a side of the gate structures in the semiconductor substrate so that the lightly doped region is between the heavily doped region and the channel region;
    forming a dielectric layer on the semiconductor substrate having the gate structures;
    forming contact holes in the dielectric layer to expose parts of the impurity regions at sides of the gate structures;
    directly implanting impurity ions into the exposed parts of the impurity regions via the contact holes by using the gate structures as ion implanting masks, wherein the impurity ions prevent impurities doped in the impurity regions from diffusing to channel regions of the gate structures, and wherein directly implanting impurity ions takes place after forming the heavily doped region;
    annealing the impurity regions after directly implanting impurity ions; and
    forming conductive plugs in the contact holes after annealing the impurity regions.

2. The method as claimed in claim 1, wherein the impurity ions include fluoride ions.

3. The method as claimed in claim 2, wherein the directly implanting impurity ions includes performing a dry cleaning process using plasma containing fluoride radicals to implant fluoride ions into the impurity regions while cleaning the exposed parts of the impurity regions.

4. The method as claimed in claim 1, wherein the directly implanting impurity ions includes:
    cleaning the exposed parts of the impurity regions; and
    implanting fluoride ions into the impurity regions through an ion implanting process.

5. The method as claimed in claim 1, wherein directly implanting impurity ions includes:
    performing a dry cleaning process using plasma containing fluoride radicals while cleaning the exposed parts of the impurity regions to implant fluoride ions into the impurity regions; and subsequently, performing an ion implanting process to implant fluoride ions into the impurity regions.

6. The method as claimed in claim 1, wherein the conductive plugs include metal plugs or polysilicon plugs.

7. The method as claimed in claim 1, wherein directly implanting impurity ions includes implanting impurity ions only in the heavily doped region.

8. The method as claimed in claim 1, wherein the semiconductor substrate includes a memory region and a peripheral circuit region in which the gate structures and the impurity regions are arranged, and
directly implanting impurity ions is performed in the peripheral circuit region and includes directly implanting fluoride ions into the impurity regions in the peripheral circuit region.

9. The method as claimed in claim 1, wherein the semiconductor substrate includes a high-voltage region, a medium-voltage region, and a low-voltage region, and
directly implanting impurity ions includes directly implanting fluoride ions into the impurity regions in at least one of the high-voltage region, the medium-voltage region, and the low-voltage region so that the at least one region is directly implanted with more fluoride ions than at least one of the other regions.

10. The method as claimed in claim 9, wherein:
the fluoride ions are directly implanted in the impurity region of the high-voltage region and the medium-voltage region, and
directly implanting impurity ions in the impurity region of the high-voltage region and the medium-voltage region includes forming a photosensitive layer on the low-voltage region, the photosensitive layer preventing fluoride ion implantation in the low-voltage region.

11. The method as claimed in claim 10, wherein directly implanting impurity ions includes performing a dry cleaning process using plasma containing fluoride radicals and performing a separate fluoride ion implanting process on the semiconductor substrate.

12. The method as claimed in claim 9, wherein:
the fluoride ions are directly implanted in the impurity region of the high-voltage region, and
directly implanting impurity ions in the impurity region of the high-voltage region includes forming a photosensitive layer on the low-voltage region and the medium-voltage region, the photosensitive layer preventing fluoride ion implantation in the low-voltage region and the medium-voltage region.

13. The method as claimed in claim 12, wherein the directly implanting impurity ions includes performing a dry cleaning process using plasma containing fluoride radicals and performing a separate fluoride ion implanting process on the semiconductor substrate.

14. The method as claimed in claim 9, wherein directly implanting impurity ions includes:
performing a dry cleaning process on the semiconductor substrate using plasma containing fluoride radicals,
forming a photosensitive layer on at least one of the high-voltage region, the medium-voltage region, and the low-voltage region, the photosensitive layer protecting the at least one high-voltage region, medium-voltage region, and low-voltage region from fluoride ion implantation, and
performing an ion implanting process on the semiconductor substrate.

15. The method as claimed in claim 14, wherein the photosensitive layer is formed on the low-voltage region to prevent fluoride ion implantation in the low-voltage region.

16. The method as claimed in claim 14, wherein the photosensitive layer is formed on the low-voltage region and the medium-voltage region to prevent fluoride ion implantation in the low-voltage region and the medium-voltage region.

17. The method as claimed in claim 1, further comprising implanting impurities into the impurity region of the same conductive type as the impurities already in the impurity region after directly implanting impurity ions and prior to forming the conductive plugs.

* * * * *